(12) United States Patent
Li et al.

(10) Patent No.: US 11,152,221 B2
(45) Date of Patent: Oct. 19, 2021

(54) METHODS AND APPARATUS FOR METAL SILICIDE DEPOSITION

(71) Applicant: Applied Materials, Inc., Santa Clara, CA (US)

(72) Inventors: Xuebin Li, Sunnyvale, CA (US); Wei Liu, Santa Clara, CA (US); Gaurav Thareja, Santa Clara, CA (US); Shashank Sharma, Fremont, CA (US); Patricia M. Liu, Saratoga, CA (US); Schubert Chu, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 42 days.

(21) Appl. No.: 16/784,460

(22) Filed: Feb. 7, 2020

(65) Prior Publication Data

US 2020/0266068 A1 Aug. 20, 2020

Related U.S. Application Data

(60) Provisional application No. 62/808,158, filed on Feb. 20, 2019.

(51) Int. Cl.
*H01L 21/321* (2006.01)
*H01L 21/285* (2006.01)
(Continued)

(52) U.S. Cl.
CPC .... *H01L 21/3211* (2013.01); *H01L 21/02068* (2013.01); *H01L 21/02614* (2013.01);
(Continued)

(58) Field of Classification Search
CPC ..... H01L 21/823418; H01L 21/823814; H01L 21/02362; H01L 21/02425;
(Continued)

(56) References Cited

U.S. PATENT DOCUMENTS

| 7,897,468 B1* | 3/2011 | Luo ..................... H01L 29/7831 438/283 |
| 2007/0155074 A1 | 7/2007 | Ho et al. |

(Continued)

OTHER PUBLICATIONS

"Mann et al., Silicides and local interconnections for high-performance VLSI applications, 1995, IBM J. Res. Develop. vol. 39 No. 4 Jul. 1995, pp. 403-417" (Year: 1995).*

(Continued)

*Primary Examiner* — Eduardo A Rodela
(74) *Attorney, Agent, or Firm* — Patterson + Sheridan, LLP

(57) ABSTRACT

Methods and apparatuses for processing substrates, such as during metal silicide applications, are provided. In one or more embodiments, a method of processing a substrate includes depositing an epitaxial layer on the substrate, depositing a metal silicide seed layer on the epitaxial layer, and exposing the metal silicide seed layer to a nitridation process to produce a metal silicide nitride layer from at least a portion of the metal silicide seed layer. The method also includes depositing a metal silicide bulk layer on the metal silicide nitride layer and forming or depositing a nitride capping layer on the metal silicide bulk layer, where the nitride capping layer contains a metal nitride, a silicon nitride, a metal silicide nitride, or a combination thereof.

19 Claims, 3 Drawing Sheets

(51) Int. Cl.
*H01L 21/768* (2006.01)
*H01L 21/67* (2006.01)
*H01L 29/40* (2006.01)
*H01L 21/02* (2006.01)
*H01L 23/532* (2006.01)
*H01L 21/8234* (2006.01)
*H01L 21/3205* (2006.01)
*H01L 29/417* (2006.01)

(52) U.S. Cl.
CPC .. *H01L 21/28518* (2013.01); *H01L 21/32053* (2013.01); *H01L 21/67167* (2013.01); *H01L 21/67207* (2013.01); *H01L 21/76871* (2013.01); *H01L 21/823418* (2013.01); *H01L 23/53209* (2013.01); *H01L 29/40* (2013.01); *H01L 29/41783* (2013.01)

(58) Field of Classification Search
CPC ......... H01L 21/02614; H01L 21/28052; H01L 21/32051; H01L 21/32053; H01L 21/3211; H01L 21/76829; H01L 21/76889; H01L 29/0843; H01L 29/0847; H01L 29/41725; H01L 29/41783; H01L 29/40; H01L 29/43; H01L 29/45; H01L 23/53209
See application file for complete search history.

(56) References Cited

U.S. PATENT DOCUMENTS

| | | |
|---|---|---|
| 2014/0248761 A1 | 9/2014 | Park et al. |
| 2017/0178927 A1* | 6/2017 | Biggs ................ H01L 21/32053 |
| 2017/0372888 A1 | 12/2017 | Thapa et al. |
| 2018/0230634 A1 | 8/2018 | Reddy et al. |
| 2020/0091011 A1* | 3/2020 | Khaderbad ........... H01L 29/456 |
| 2021/0083090 A1* | 3/2021 | Wang .................. H01L 29/0669 |

OTHER PUBLICATIONS

Taiwan Office Action dated Sep. 14, 2020 for Application No. 109104006.

\* cited by examiner

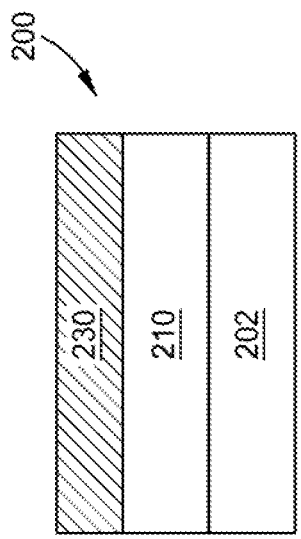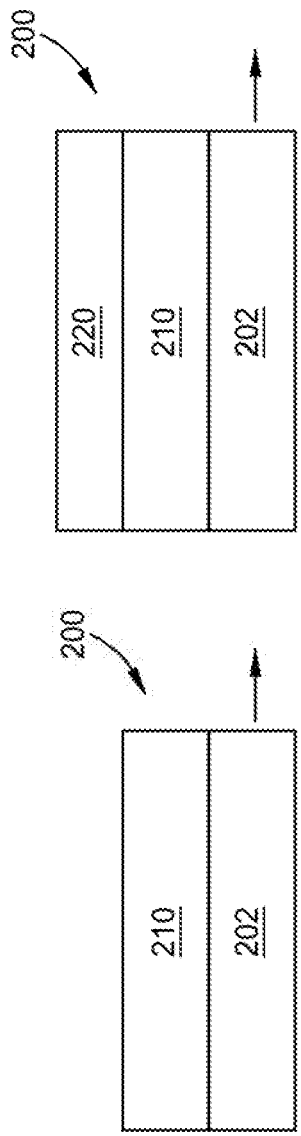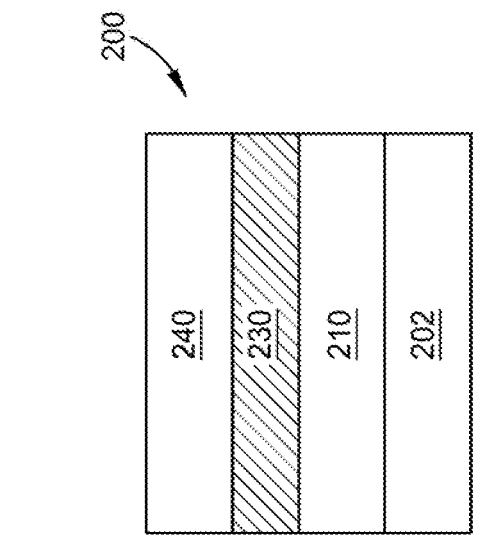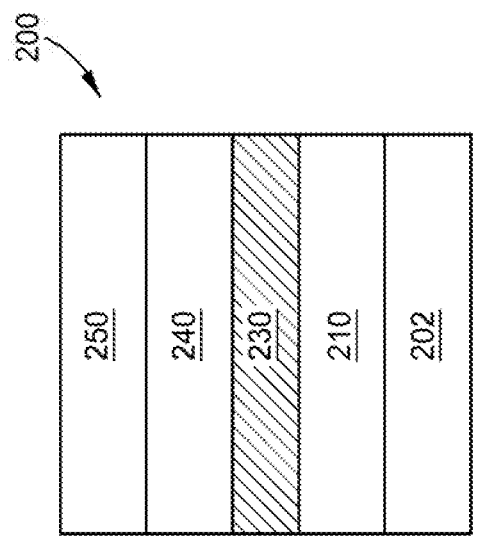

METHODS AND APPARATUS FOR METAL SILICIDE DEPOSITION

CROSS-REFERENCE TO RELATED APPLICATIONS

This application claims benefit to U.S. Appl. No. 62/808,158, filed on Feb. 20, 2019, which is herein incorporated by reference.

BACKGROUND

Field

Embodiments of the present disclosure generally relate to methods and apparatuses for depositing materials, more particularly, to methods for depositing metal silicide films.

Description of the Related Art

Metal silicide films (e.g., titanium silicide or nickel silicide) are currently used in source/drain (S/D) contact area for RC reduction in nMOS and pMOS. At high temp annealing (e.g., about 700° C.), agglomeration occurs on the metal silicide films in which polysilicon grains tend to spheroidize between grain boundaries, causing film discontinuity and higher resistivity.

Thus, there is a need for improved methods and an apparatus for preparing metal silicide films on source/drain contact areas.

SUMMARY OF THE INVENTION

Embodiments discussed and described herein provide methods and apparatuses for processing substrates. In one or more embodiments, a method of processing a substrate includes depositing an epitaxial layer on the substrate, depositing a metal silicide seed layer on the epitaxial layer, and exposing the metal silicide seed layer to a nitridation process to produce a metal silicide nitride layer from at least a portion of the metal silicide seed layer. The method also includes depositing a metal silicide bulk layer on the metal silicide nitride layer and forming or depositing a nitride capping layer on the metal silicide bulk layer, where the nitride capping layer contains a metal nitride, a silicon nitride, a metal silicide nitride, or a combination thereof.

In other embodiments, a method of processing a substrate includes depositing an epitaxial layer on the substrate, exposing the epitaxial layer to a clean process, then depositing a metal silicide seed layer on the epitaxial layer. The metal silicide seed layer contains titanium silicide or nickel silicide and has a thickness of about 0.2 nm to about 2.5 nm. The method also includes exposing the metal silicide seed layer to a nitridation process to produce a metal silicide nitride layer from at least a portion of the metal silicide seed layer and depositing a metal silicide bulk layer on the metal silicide nitride layer. The metal silicide bulk layer contains titanium silicide or nickel silicide and has a thickness of about 4 nm to about 20 nm. The method further includes forming or depositing a nitride capping layer on the metal silicide bulk layer, where the nitride capping layer contains a metal nitride, a silicon nitride, a metal silicide nitride, or a combination thereof.

In other embodiments, a cluster tool for processing a substrate includes a transfer chamber coupled to a load-lock chamber, a cleaning chamber coupled to the transfer chamber, the cleaning chamber contains an inductively coupled plasma source and is in fluid communication with a source of hydrogen, and an epitaxy chamber coupled to the transfer chamber, the epitaxy chamber contains a liquid precursor vaporizer and is in fluid communication with a first source of silicon. The cluster tool also includes a silicide chamber coupled to the transfer chamber and a nitridation chamber coupled to the transfer chamber. The silicide chamber contains a remote plasma system and is in fluid communication with a second source of silicon and a source of a metal-containing compound. The nitridation chamber contains a plasma source and is in fluid communication with a source of nitrogen.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIGS. 2A-2E depict cross-sectional views of a substrate during various stages of fabrication, as discussed and described in one or more embodiments herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments discussed and described herein provide methods and apparatuses for processing substrates. In one or more embodiments, a method includes depositing an epitaxial layer (e.g., a source/drain film in an nMOS or pMOS application) on the substrate, depositing a metal silicide seed layer on the epitaxial layer, and exposing the metal silicide seed layer to a nitridation process to produce a metal silicide nitride layer from at least a portion of the metal silicide seed layer. The method also includes depositing a metal silicide bulk layer on the metal silicide nitride layer and depositing a nitride capping layer on the metal silicide bulk layer, where the nitride capping layer contains a metal nitride, a silicon nitride, or a combination thereof.

Methods described and discussed herein provide many advantages over previous process techniques. The metal silicide nitride layer at the interface between the epitaxial layer and the metal silicide bulk layer provides thermal stability to the metal silicide bulk layer in later thermal processes. This thermal stability reduces or eliminates agglomeration to the metal silicide bulk layer which otherwise would cause film discontinuity and greater resistivity (Rc). The nitride capping layer deposited or otherwise disposed on the metal silicide bulk layer reduces or prevents oxidation to the metal silicide bulk layer.

Figure 1:
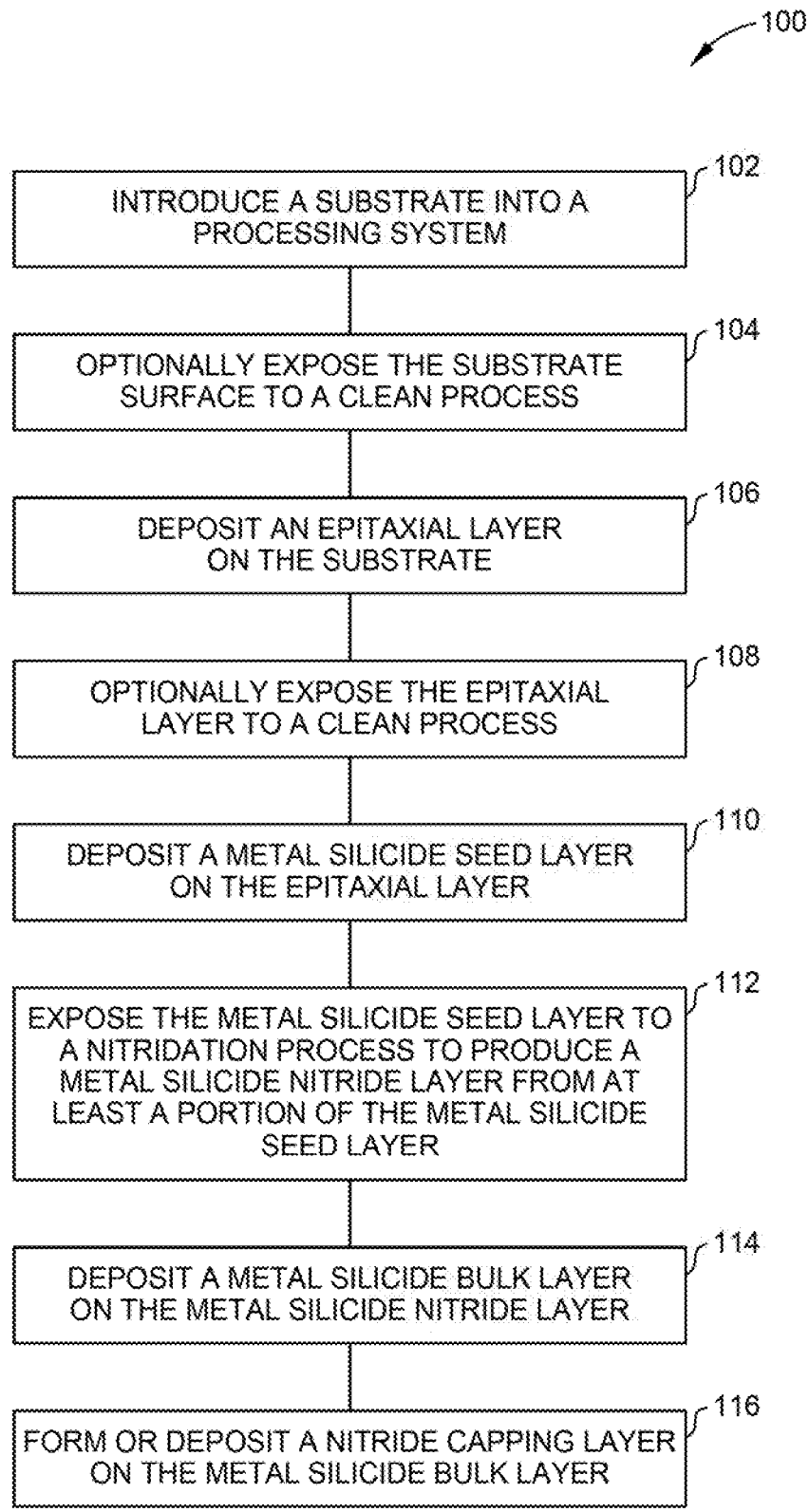
FIG. 1 is a flow chart illustrating a method of processing a substrate, as discussed and described in one or more embodiments herein.

FIG. 1 is a flow chart illustrating a method 100 for processing a substrate, as discussed and described in one or more embodiments herein. In one or more examples, the epitaxial layers or films are source/drain layers and films in a contact area utilized in nMOS and/or pMOS applications. FIGS. 2A-2E illustrate cross-sectional views of a simplified substrate, a film stack, or semiconductor structure 200 during certain stages of fabrication according to the flow chart of FIG. 1. Those skilled in the art will further recognize that the full process for forming a semiconductor device and the associated structures are not illustrated in the drawings or described herein. Instead, for simplicity and clarity, only so much of a process for forming a semiconductor device and the associated structures as is necessary for an understanding of the present disclosure is depicted and described. In addition, although various operations are illustrated in the drawings and described herein, no limitation regarding the order of such operations or the presence or absence of intervening operations is implied. Operations depicted or described as sequential are, unless explicitly specified, merely done so for purposes of explanation without precluding the possibility that the respective operations are actually performed in concurrent or overlapping manner, at least partially if not entirely.

In one or more embodiments, the process 100 begins at block 102 in FIG. 1 by loading, placing or otherwise introducing a substrate or semiconductor structure 200 into a processing system containing a plurality of processing chambers. The substrate or semiconductor structure 200 contains an underlying wafer or substrate 202 and an epitaxial layer 210 disposed on the substrate 202, as shown in FIG. 2A.

The terms "substrate" and "wafer" as used herein are intended to broadly cover any object that can be processed in a process chamber. For example, the wafer or substrate 202 may be any substrate capable of having material deposited thereon, such as a silicon substrate, for example silicon (doped or undoped), crystalline silicon (e.g., Si <100> or Si <111>), silicon oxide, strained silicon, doped or undoped polysilicon, or the like, germanium, a III-V compound substrate, a silicon germanium (SiGe) substrate, a silicon germanium carbide (SiGeC) substrate, a silicon germanium oxide (SiGeO) substrate, a silicon germanium oxynitride (SiGeON) substrate, a silicon carbide (SiC) substrate, a silicon carbonitride (SiCN) substrate, a silicon carbonoxide (SiCO), an epi substrate, a silicon-on-insulator (SOI) substrate, a carbon doped oxide, a silicon nitride, a display substrate such as a liquid crystal display (LCD), a plasma display, an electro luminescence (EL) lamp display, a solar array, solar panel, a light emitting diode (LED) substrate, a patterned or non-patterned semiconductor wafer, glass, sapphire, or any other materials such as metals, metal alloys, and other conductive materials. The wafer or substrate 202 may be a planar substrate or a patterned substrate. Patterned substrates are substrates that include electronic features formed into or onto a processing surface of the substrate. The substrate 202 may include multiple layers, or include, for example, partially fabricated devices such as transistors, flash memory devices, and the like. In one or more examples, the substrate 202 is a monocrystalline silicon-germanium (SiGe) wafer. In other examples, the substrate 202 is a monocrystalline silicon wafer, such as a P-doped silicon wafer.

In one or more embodiments, prior to depositing the epitaxial layer 210, the substrate 202 can be optionally exposed to one or more clean processes, at block 104. For example, one or more upper surfaces on the substrate 202 can be exposed to the clean process. The surfaces of the substrate 202 may contain contaminants including oxides, carbon-containing contaminants, particulates, and/or other contaminants. In some embodiments, the clean process includes generating a plasma from a reagent gas contain hydrogen ($H_2$) and exposing the substrate 202 to the plasma. In other embodiment, the clean process includes generating a plasma from a reagent gas containing ammonia and nitrogen trifluoride and exposing the substrate 202 to the plasma. The substrate 202 is exposed to the clean process and/or the plasma for a period of about 0.1 seconds to about 10 minutes.

At block 104, in some embodiments, the surfaces of the substrate 202 are exposed to a plasma treatment to remove at least a portion of the contaminant 220 disposed from the silicon-containing fins 203. The plasma treatment includes exposing the substrate 202 to a hydrogen plasma within a processing chamber. The hydrogen plasma removes at least some or all of oxides, carbon, and/or other contaminant disposed thereon.

In some configurations, the hydrogen plasma cleaning process may be performed in a processing chamber using a remote plasma source. For example, the processing chamber may be an AKTIV Pre-Clean® chamber, commercially available from Applied Materials, Inc. of Santa Clara, Calif. In other examples, the hydrogen plasma cleaning process may be performed in an etch chamber using an inductively coupled plasma (ICP) source.

The substrate 200 can be exposed to the hydrogen plasma for a period of less than 20 minutes or less than 15 minutes, such as about 0.1 seconds, about 0.5 seconds, about 1 second, about 10 seconds, about 30 seconds, or about 60 seconds to about 1.5 minutes, about 2 minutes, about 3 minutes, about 4 minutes, about 5 minutes, about 7 minutes, or about 10 minutes. For example, the substrate 200 can be exposed to the hydrogen plasma for a period of about 0.1 seconds to about 10 minutes, about 0.1 seconds to about 8 minutes, about 0.1 seconds to about 5 minutes, or about 0.1 seconds to about 3 minutes. In one or more examples, the substrate 200 is exposed to the hydrogen plasma for less than 5 minutes. During the hydrogen plasma process, the plasma processing chamber may be have an inner pressure of about 10 mTorr to about 300 Torr, such as about 10 mTorr to about 500 mTorr or about 20 Torr to about 300 Torr.

In other embodiments, at block 104 in FIG. 1, the surfaces of the substrate 200 are exposed to a dry-clean treatment to remove oxides, carbons, particulates, and/or other contaminants. Any suitable dry-clean treatment process that removes oxides from the substrate without significantly damaging the substrate 200 may be used. Suitable dry-clean treatment processes include sputter etch processes, plasma-based oxide etch processes, or combinations thereof. The dry-clean treatment can include exposing the substrate 200 to an etchant and to plasma, ions, radicals, or a combination thereof. The etchant can be or include one or more fluorine, chlorine, nitrogen, plasmas thereof, ions thereof, radicals thereof, or any combination thereof. The dry-clean treatment includes exposing the substrate 200 to a fluorine plasma generated from a combination of nitrogen trifluoride ($NF_3$) and ammonia ($NH_3$). Exemplary plasma-based oxide etch processes include $NF_3/NH_3$ inductively coupled plasma processes or $NF_3/NH_3$ capacitively coupled plasma processes.

In one or more embodiments, the dry-clean treatment, at block 104, is a plasma-based oxide etch process that is a remote plasma assisted dry etch process which involves the simultaneous exposure of a substrate to $NF_3$ and $NH_3$ plasma by-products. In some examples, the plasma-based oxide etch process may be similar to or may include a SICONI® etch process that is commercially available from Applied Materials, Inc. of Santa Clara, Calif. The SICONI® etch process may be performed in a SICONI® Preclean chamber, commercially available from Applied Materials, Inc. of Santa Clara, Calif.

In some examples that use remote plasma, excitation of the gas species allows plasma-damage-free substrate processing. The remote plasma etch can be largely conformal and selective towards silicon oxide layers, and thus does not readily etch silicon regardless of whether the silicon is amorphous, crystalline or polycrystalline. The remote plasma process will generally produce solid by-products which grow on the surface of the substrate 202 as material is removed. The solid by-products can be subsequently removed via sublimation when the temperature of the substrate or semiconductor structure 200 is raised (e.g., 300° C.). The plasma etch process results in the removal of oxides and a substrate surface having silicon-hydrogen (Si—H) bonds thereon.

In some examples, the dry-clean treatment process may be performed to the substrate 202 in a processing chamber using or fluidly couple to a remote plasma source (RPS). For example, the processing chamber may be an AKTIV Pre-Clean® chamber, commercially available from Applied Materials, Inc. of Santa Clara, Calif. In other examples, the dry-clean treatment process may be performed in an etch chamber using an ICP source. For example, the etch chamber may be a Centura® Advantedge® Mesa® Etch chamber, commercially available from Applied Materials, Inc. of Santa Clara, Calif. Alternatively, the cleaning process may be performed in an etch chamber employing a radical-based chemistry.

The substrate 202 is exposed to the etchant during the dry-clean treatment to remove the contaminants for a period of about 20 minutes or less. The substrate 202 can be exposed to the etchant for a period of about 10 seconds, about 20 seconds, about 30 seconds, about 45 seconds, about 1 minute, about 1.5 minutes, or about 2 minutes to about 3 minutes, about 5 minutes, about 7 minutes, about 10 minutes, about 12 minutes, about 15 minutes, or about 20 minutes.

At block 106 in FIG. 1, the epitaxial layer 210 is deposited, grown, or otherwise formed on the substrate 200, as depicted in FIG. 2A. The process 100 can be applied to the substrate 200 prior to various different types of fabrication applications. The epitaxial layer 210 can be a source/drain film or layer in a contact area of an nMOS or pMOS device, or alternately, the epitaxial layer 210 can be used as other types of layers in different applications.

In one or more embodiments, the substrate 200 is exposed to one or more processing reagents in, for example, a gas phase epitaxy chamber at a target temperature for epitaxial deposition of a silicon-containing layer. An exemplary epitaxy chamber that may be used is a Centura® RP EPI chamber available from Applied Materials, Inc. of Santa Clara, Calif. The target temperature for epitaxial deposition may be between about 250° C. and about 600° C., such as about 300° C. to about 500° C., for example about 350° C. to about 400° C. The pressure within the epitaxy chamber is kept relatively low, for example, less than about 50 Torr, such as about 10 Torr to about 40 Torr.

In some examples, the processing reagent may include one or more deposition gases and at least one dopant gas. The deposition gas may include one or more precursor gases selected from Group III precursor gas, Group IV precursor gas, Group V precursor gas, or Group VI precursor gas. In cases where a silicon-containing epitaxial layer is formed, the deposition gas may contain at least a silicon source. Exemplary silicon sources may include, but are not limited to, silanes, halogenated silanes, silicon tetrachloride ($SiCl_4$), or any combinations thereof. Silanes may include silane ($SiH_4$) and higher silanes with the empirical formula $Si_xH_{(2x+2)}$, such as disilane ($Si_2H_6$), trisilane ($Si_3H_8$), tetrasilane ($Si_4H_{10}$), pentasilane ($Si_5H_{12}$), or hexasilane ($Si_6H_{14}$). Other higher silanes, such as a silicon hydride expressed as $Si_nH_2n$ (n is a natural number equal to or greater than 3), may also be used. For example, cyclotrisilane ($Si_3H_6$), cyclotetrasilane ($Si_4H_8$), cyclopentasilane ($Si_5H_{10}$), cyclohexasilane ($Si_6H_{12}$), or cycloheptasilane ($Si_7H_{14}$). Halogenated silanes may include monochlorosilane (MCS), dichlorosilane (DCS), trichlorosilane (TCS), hexachlorodisilane (HCDS), octachlorotrisilane (OCTS), silicon tetrachloride (STC), or a combination thereof. In some examples, silanes may include higher order silanes with varying degrees of halogenation (e.g., halosilanes) in the form of F, Cl, Br, or I attached to them in order to enable selectivity. For example, one or more halo silanes can be or include $Si_2H_4Cl_2$ or $Si_3H_5Cl_3$.

The dopant gas can be or include, but is not limited to phosphorous, boron, arsenic, gallium, or aluminum, depending on the desired conductive characteristic of the deposited epitaxial layer. The deposition gas may optionally contain at least one secondary elemental source, such as a germanium source or a carbon source. Depending on application, other elements, such as metals, halogens or hydrogen may be incorporated within a silicon-containing layer. In one or more examples, the silicon-containing epitaxial layer is phosphorous doped silicon (Si:P), which can be achieved using a dopant such as phosphine ($PH_3$), phosphorus trichloride (PCIS), phosphorous tribromide ($PBr_3$), and phosphates such as tributyl phosphate (TBP).

The processing reagents may optionally include a carrier gas. The carrier gas may be selected based on the precursor(s) used and/or the process temperature during the epitaxial process. Suitable carrier gases can be or include nitrogen, hydrogen, argon, helium, or other gases which are inert with respect to the epitaxial process. Nitrogen may be utilized as a carrier gas in examples featuring low temperature (e.g., less than 600° C.) processes. The carrier gas may have a flow rate from about 1 slm (standard liters per minute) to about 100 slm, such as from about 3 slm to about 30 slm.

In one or more embodiments, the epitaxial layer 210 can be optionally exposed to one or more clean processes, at block 108. For example, one or more surfaces of the epitaxial layer 210 can be exposed to the clean process. The surfaces of the epitaxial layer 210 may contain contaminants including oxides, carbon-containing contaminants, particulates, and/or other contaminants. In some embodiments, the clean process includes generating a plasma from a reagent gas contain hydrogen ($H_2$) and exposing the epitaxial layer 210 to the plasma. In other embodiment, the clean process includes generating a plasma from a reagent gas containing ammonia and nitrogen trifluoride and exposing the epitaxial layer 210 to the plasma. The epitaxial layer 210 is exposed to the clean process and/or the plasma for a period of about 0.1 seconds to about 10 minutes.

At block 108, in some embodiments, the surfaces of epitaxial layer 210 are exposed to a plasma treatment to remove contaminants disposed thereon. The plasma treatment includes exposing the substrate 202 to a hydrogen plasma within a processing chamber. The hydrogen plasma removes at least some or all of oxides, carbon, and/or other contaminant disposed thereon.

In some configurations, the hydrogen plasma cleaning process may be performed in a processing chamber using a remote plasma source. For example, the processing chamber may be an AKTIV Pre-Clean® chamber, commercially available from Applied Materials, Inc. of Santa Clara, Calif. In other examples, the hydrogen plasma cleaning process may be performed in an etch chamber using an inductively coupled plasma (ICP) source.

The epitaxial layer 210 can be exposed to the hydrogen plasma for a period of less than 20 minutes or less than 15 minutes, such as about 0.1 seconds, about 0.5 seconds, about 1 second, about 10 seconds, about 30 seconds, or about 60 seconds to about 1.5 minutes, about 2 minutes, about 3 minutes, about 4 minutes, about 5 minutes, about 7 minutes, or about 10 minutes. For example, the epitaxial layer 210 can be exposed to the hydrogen plasma for a period of about 0.1 seconds to about 10 minutes, about 0.1 seconds to about 8 minutes, about 0.1 seconds to about 5 minutes, or about 0.1 seconds to about 3 minutes. In one or more examples, the epitaxial layer 210 is exposed to the hydrogen plasma for less than 5 minutes. During the hydrogen plasma process, the plasma processing chamber may be have an inner pressure of about 10 mTorr to about 300 Torr, such as about 10 mTorr to about 500 mTorr or about 20 Torr to about 300 Torr.

In other embodiments, at block 108 in FIG. 1, the surfaces of the epitaxial layer 210 are exposed to a dry-clean treatment to remove oxides, carbons, particulates, and/or other contaminants. Any suitable dry-clean treatment process that removes oxides from the substrate without significantly damaging the epitaxial layer 210 may be used. Suitable dry-clean treatment processes include sputter etch processes, plasma-based oxide etch processes, or combinations thereof. The dry-clean treatment can include exposing the epitaxial layer 210 to an etchant and to plasma, ions, radicals, or a combination thereof. The etchant can be or include one or more fluorine, chlorine, nitrogen, plasmas thereof, ions thereof, radicals thereof, or any combination thereof. The dry-clean treatment includes exposing the epitaxial layer 210 to a fluorine plasma generated from a combination of nitrogen trifluoride ($NF_3$) and ammonia ($NH_3$). Exemplary plasma-based oxide etch processes include $NF_3$/$NH_3$ inductively coupled plasma processes or $NF_3$/$NH_3$ capacitively coupled plasma processes.

In one or more embodiments, the dry-clean treatment, at block 108, is a plasma-based oxide etch process that is a remote plasma assisted dry etch process which involves the simultaneous exposure of the epitaxial layer 210 to $NF_3$ and $NH_3$ plasma by-products. In some examples, the plasma-based oxide etch process may be similar to or may include a SICONI® etch process that is commercially available from Applied Materials, Inc. of Santa Clara, Calif. The SICONI® etch process may be performed in a SICONI® Preclean chamber, commercially available from Applied Materials, Inc. of Santa Clara, Calif.

In some examples that use remote plasma, excitation of the gas species allows plasma-damage-free substrate processing. The remote plasma etch can be largely conformal and selective towards silicon oxide layers, and thus does not readily etch silicon regardless of whether the silicon is amorphous, crystalline or polycrystalline. The remote plasma process will generally produce solid by-products which grow on the surface of the epitaxial layer 210 as material is removed. The solid by-products can be subsequently removed via sublimation when the temperature of the substrate or semiconductor structure 200 is raised (e.g., 300° C.). The plasma etch process results in the removal of oxides and a substrate surface having silicon-hydrogen (Si—H) bonds thereon.

In some examples, the dry-clean treatment process of the epitaxial layer 210 may be performed in a processing chamber using an RPS. For example, the processing chamber may be an AKTIV Pre-Clean® chamber, commercially available from Applied Materials, Inc. of Santa Clara, Calif. In other examples, the dry-clean treatment process may be performed in an etch chamber using an ICP source. For example, the etch chamber may be a Centura® Advantedge® Mesa® Etch chamber, commercially available from Applied Materials, Inc. of Santa Clara, Calif. Alternatively, the cleaning process may be performed in an etch chamber employing a radical-based chemistry.

The epitaxial layer 210 is exposed to the etchant during the dry-clean treatment to remove the contaminants for a period of about 20 minutes or less. The epitaxial layer 210 can be exposed to the etchant for a period of about 10 seconds, about 20 seconds, about 30 seconds, about 45 seconds, about 1 minute, about 1.5 minutes, or about 2 minutes to about 3 minutes, about 5 minutes, about 7 minutes, about 10 minutes, about 12 minutes, about 15 minutes, or about 20 minutes.

In one or more embodiments, at block 110 in FIG. 1, a metal silicide seed layer 220 is grown, deposited, or otherwise formed on the epitaxial layer 210, as depicted in FIG. 2B. The metal silicide seed layer 220 contains titanium silicide, nickel silicide, cobalt silicide, hafnium silicide, zirconium silicide, alloys thereof, or any combination thereof. The metal silicide seed layer 220 can have a thickness of about 0.2 nm, about 0.5 nm, about 0.8 nm, or about 1 nm to about 1.2 nm, about 1.5 nm, about 1.8 nm, about 2 nm, about 2.2 nm, about 2.5 nm, or about 3 nm. For example, the metal silicide seed layer 220 can have a thickness of about 0.2 nm to about 3 nm, about 0.2 nm to about 2.5 nm, about 0.2 nm to about 2 nm, about 0.2 nm to about 1.5 nm, about 0.2 nm to about 1 nm, about 0.5 nm to about 3 nm, about 0.5 nm to about 2.5 nm, about 0.5 nm to about 2 nm, about 0.5 nm to about 1.5 nm, about 0.5 nm to about 1 nm, about 1 nm to about 3 nm, about 1 nm to about 2.5 nm, about 1 nm to about 2 nm, or about 1 nm to about 1.5 nm.

In one or more embodiments, the metal silicide seed layer 220 is grown or deposited on the epitaxial layer 210 within a processing chamber, such as a silicide chamber or epitaxy chamber. An exemplary epitaxy chamber that may be used is a Centura® RP EPI chamber available from Applied Materials, Inc. of Santa Clara, Calif.

In one or more embodiments, the metal silicide seed layer 220 can be deposited, formed, or otherwise produced by a chemical vapor deposition (CVD) process. The CVD process includes introducing one or more metal precursors and one or more silicon precursors into the processing chamber. The target temperature for depositing the metal silicide seed layer 220 is about 300° C. to about 600° C. The pressure within the processing chamber is about 5 Torr to about 300 Torr.

The metal precursor during the CVD process for depositing the metal silicide seed layer 220 can be or include one or more titanium precursors and/or one or more nickel precursors. Exemplary titanium precursors can be or include titanium tetrachloride, titanium tetrabromide, tetrakis(dimethylamino)titanium (TDMAT), tetrakis(diethylamino)titanium (TDEAT), or any combination thereof. Exemplary nickel precursors can be or include tetracarbonyl nickel, bis-methylcyclopentadienyl nickel, or any combination thereof. Exemplary silicon precursors can be or include dichlorosilane, tetrachlorosilane, hexachlorodisilane, silane, disilane, trisilane, tetrasilane, or any combination thereof.

The processing reagents or chemical precursors may optionally include a carrier gas at block 110. The carrier gas may be selected based on the precursor(s) used and/or the process temperature during the epitaxial process. Suitable carrier gases can be or include nitrogen, argon, helium, or other gases which are inert with respect to the epitaxial process. The carrier gas may have a flow rate from about 1 slm (standard liters per minute) to about 50 slm, such as from about 5 slm to about 30 slm.

In one or more embodiments, at block 112 in FIG. 1, the metal silicide seed layer 220 is exposed to a nitridation process to produce a metal silicide nitride layer 230 from at least a portion of the metal silicide seed layer 220, as depicted in FIG. 2C. In one or more examples, all of the metal silicide seed layer 220 is nitridized or otherwise converted to the metal silicide nitride layer 230. In other examples, an upper portion of the metal silicide seed layer 220 is nitridized or otherwise converted to the metal silicide nitride layer 230 while a lower portion of the metal silicide seed layer 220 is preserved as metal silicide (not shown).

In one or more embodiments, the nitridation process includes heating the substrate 202 to a process temperature, generating a plasma from a reagent gas, and exposing the metal silicide seed layer 220 to the plasma while converting at least a portion of the metal silicide seed layer 220 to the metal silicide nitride layer 230. In some examples, the reagent gas can be or include one or more nitrogen containing compounds and the plasma can include the nitrogen containing compounds, as well as ions, radicals, or derivatives thereof. The reagent gas can be or include ammonia, nitrogen ($N_2$), hydrogen ($H_2$), or any combination thereof.

The process temperature of the substrate 200 during the nitridation process can be about 100° C., about 200° C., about 250° C., about 300° C., about 350° C., or about 400° C. to about 450° C., about 500° C., about 550° C., about 600° C., about 700° C., or greater. For example, the process temperature of the substrate 200 can be about 100° C. to about 700° C., about 200° C. to about 700° C., about 200° C. to about 600° C., about 200° C. to about 500° C., about 200° C. to about 400° C., about 200° C. to about 300° C., about 300° C. to about 700° C., about 300° C. to about 600° C., about 300° C. to about 500° C., about 300° C. to about 400° C., about 300° C. to about 350° C., about 400° C. to about 700° C., about 400° C. to about 600° C., about 400° C. to about 500° C., about 400° C. to about 450° C., about 425° C. to about 475° C., or about 440° C. to about 460° C.

The nitridation process lasts for about 0.5 seconds to about 5 minutes, such as about 1 second, about 5 seconds, about 10 seconds, about 30 seconds, or about 45 seconds to about 1 minute, about 1.5 minutes, about 2 minutes, about 3 minutes, about 4 minutes, or about 5 minutes. For example, the nitridation process lasts for about 0.5 seconds to about 5 minutes, about 0.5 seconds to about 3 minutes, about 0.5 seconds to about 2 minutes, about 0.5 seconds to about 1.5 minutes, about 0.5 seconds to about 1 minute, about 0.5 seconds to about 45 seconds, about 0.5 seconds to about 30 seconds, about 0.5 seconds to about 15 seconds, about 0.5 seconds to about 5 seconds, about 5 seconds to about 5 minutes, about 5 seconds to about 3 minutes, about 5 seconds to about 2 minutes, about 5 seconds to about 1.5 minutes, about 5 seconds to about 1 minute, about 5 seconds to about 45 seconds, about 5 seconds to about 30 seconds, about 5 seconds to about 15 seconds, about 30 seconds to about 5 minutes, about 30 seconds to about 3 minutes, about 30 seconds to about 2 minutes, about 30 seconds to about 1.5 minutes, about 30 seconds to about 1 minute, or about 30 seconds to about 45 seconds.

In one or more embodiments, the metal silicide seed layer 220 is nitridized or converted to the metal silicide nitride layer 230 during the nitridation process within a processing chamber, such as a nitridation chamber, a deposition chamber, or a thermal chamber. An exemplary nitridation chamber that may be used is a Centura® DPN® chamber, or Centura® CVD TiN chamber, commercially available from Applied Materials, Inc. of Santa Clara, Calif. The nitridation or processing chamber may have an inductively coupled plasma source or may be fluidly coupled to an RPS.

In one or more embodiments, at block 114 in FIG. 1, a metal silicide bulk layer 240 is grown, deposited, or otherwise formed on the metal silicide nitride layer 230, as depicted in FIG. 2D. The metal silicide bulk layer 240 contains titanium silicide, nickel silicide, hafnium silicide, zirconium silicide, alloys thereof, or any combination thereof. The metal silicide bulk layer 240 can have a thickness of about 2 nm, about 4 nm, about 5 nm, about 6 nm, about 8 nm, or about 10 nm to about 12 nm, about 15 nm, about 18 nm, about 20 nm, about 22 nm, about 25 nm, about 30 nm, about 40 nm, or about 50 nm. For example, the metal silicide bulk layer 240 can have a thickness of about 2 nm to about 50 nm, about 4 nm to about 50 nm, about 8 nm to about 50 nm, about 10 nm to about 50 nm, about 15 nm to about 50 nm, about 20 nm to about 50 nm, about 25 nm to about 50 nm, about 30 nm to about 50 nm, about 40 nm to about 50 nm, about 2 nm to about 30 nm, about 4 nm to about 30 nm, about 8 nm to about 30 nm, about 10 nm to about 30 nm, about 15 nm to about 30 nm, about 20 nm to about 30 nm, about 25 nm to about 30 nm, about 30 nm to about 35 nm, about 2 nm to about 20 nm, about 4 nm to about 20 nm, about 8 nm to about 20 nm, about 10 nm to about 20 nm, or about 15 nm to about 20 nm.

In one or more embodiments, the metal silicide bulk layer 240 is grown, deposited, or otherwise formed on the metal silicide nitride layer 230 within a processing chamber, such as a silicide chamber or epitaxy chamber. An exemplary epitaxy chamber that may be used is a Centura® RP EPI chamber, commercially available from Applied Materials, Inc. of Santa Clara, Calif.

In one or more embodiments, the metal silicide bulk layer 240 can be deposited, formed, or otherwise produced by a CVD process. The CVD process includes introducing one or more metal precursors and one or more silicon precursors into the processing chamber. The target temperature for depositing the metal silicide bulk layer 240 is about 300° C. to about 600° C. The pressure within the processing chamber is about 5 Torr to about 300 Torr.

The metal precursor during the CVD process for depositing the metal silicide bulk layer 240 can be or include one or more titanium precursors and/or one or more nickel precursors. Exemplary titanium precursors can be or include titanium tetrachloride, titanium tetrabromide, tetrakis(dimethylamino)titanium (TDMAT), tetrakis(diethylamino)titanium (TDEAT), or any combination thereof. Exemplary nickel precursors can be or include tetracarbonyl nickel, bis-methylcyclopentadienyl nickel, or any combination thereof. Exemplary silicon precursors can be or include dichlorosilane, tetrachlorosilane, hexachlorodisilane, silane, disilane, trisilane, tetrasilane, or any combination thereof.

The processing reagents or chemical precursors may optionally include a carrier gas at block 114. The carrier gas may be selected based on the precursor(s) used and/or the process temperature during the epitaxial process. Suitable carrier gases can be or include nitrogen, argon, helium, or other gases which are inert with respect to the epitaxial process. The carrier gas may have a flow rate from about 1 slm to about 50 slm, such as from about 5 slm to about 30 slm.

In one or more embodiments, at block 116 in FIG. 1, a nitride capping layer 250 is grown, formed, deposited, or otherwise produced on the metal silicide bulk layer 240, as depicted in FIG. 2E. The nitride capping layer 250 contains one or more metal nitrides, a silicon nitride, a metal silicide nitride, or any combination thereof. In some examples, the nitride capping layer 250 contains titanium nitride, nickel nitride, silicon nitride, or any combination thereof.

In one or more embodiments, the method at block 116 includes forming or depositing the nitride capping layer on the metal silicide bulk layer, which includes: a) exposing the metal silicide bulk layer to a nitridation process to convert at least a portion of the metal silicide bulk layer to the metal silicide nitride while producing the nitride capping layer containing the metal silicide nitride; b) depositing a metal nitride layer by a vapor deposition process while producing the nitride capping layer containing the metal nitride; c) depositing a metal layer by a vapor deposition process and exposing the metal layer to a nitridation process to convert the metal layer to the metal nitride while producing the nitride capping layer containing the metal nitride; or d) depositing a silicon nitride layer by a vapor deposition process while producing the nitride capping layer containing the silicon nitride.

The nitride capping layer 250 can have a thickness of about 0.2 nm, about 0.5 nm, about 0.8 nm, or about 1 nm to about 1.2 nm, about 1.5 nm, about 1.8 nm, about 2 nm, about 2.2 nm, about 2.5 nm, or about 3 nm. For example, the nitride capping layer 250 can have a thickness of about 0.2 nm to about 3 nm, about 0.2 nm to about 2.5 nm, about 0.2 nm to about 2 nm, about 0.2 nm to about 1.5 nm, about 0.2 nm to about 1 nm, about 0.5 nm to about 3 nm, about 0.5 nm to about 2.5 nm, about 0.5 nm to about 2 nm, about 0.5 nm to about 1.5 nm, about 0.5 nm to about 1 nm, about 1 nm to about 3 nm, about 1 nm to about 2.5 nm, about 1 nm to about 2 nm, or about 1 nm to about 1.5 nm.

In one or more embodiments, the nitride capping layer 250 is grown, formed, deposited, or otherwise produced within a processing chamber, such as a nitridation chamber, a deposition chamber, or a thermal chamber. An exemplary deposition and/or nitridation chamber that may be used is a Centura® DPN® chamber, a Centura® CVD TiN chamber, or a Centura® ALD TiN chamber, each commercially available from Applied Materials, Inc. of Santa Clara, Calif. The processing chamber may have an inductively coupled plasma source or may be fluidly coupled to an RPS.

In one or more embodiments, the nitride capping layer 250 can be deposited, formed, or otherwise produced by a CVD process, an atomic layer deposition (ALD) process, including thermal and/or plasma variations thereof. In some examples, the CVD process or the ALD process includes introducing one or more metal precursors and one or more nitrogen precursors into the processing chamber and directly depositing a metal nitride layer. In other examples, the CVD process or the ALD process includes introducing one or more metal precursors and one or more reducing agents into the processing chamber and directly depositing a metal layer, and thereafter, exposing the metal layer to a nitridation process. In further examples, the CVD process or the ALD process includes introducing one or more silicon precursors and one or more nitrogen precursors into the processing chamber and directly depositing a silicon nitride layer.

The target temperature for depositing the metal nitride layer or the metal layer for the nitride capping layer 250 is about 300° C. to about 600° C. The pressure within the processing chamber is about 0.001 Torr to about 40 Torr. The metal precursor during the CVD process or the ALD process for depositing the nitride capping layer 250 can be or include one or more titanium precursors and/or one or more nickel precursors. Exemplary titanium precursors can be or include titanium tetrachloride, titanium tetrabromide, tetrakis(dimethylamino)titanium (TDMAT), tetrakis(diethylamino)titanium (TDEAT), or any combination thereof. Exemplary nickel precursors can be or include tetracarbonyl nickel, bis-methylcyclopentadienyl nickel, or any combination thereof. Exemplary nitride precursors and/or reducing agents can be or include ammonia, ammonia plasma, nitrogen plasma, hydrogen ($H_2$), hydrogen plasma, or any combination thereof. Exemplary silicon precursors can be or include dichlorosilane, tetrachlorosilane, hexachlorodisilane, silane, disilane, trisilane, tetrasilane, or any combination thereof.

The processing reagents or chemical precursors may optionally include a carrier gas at block 116. The carrier gas may be selected based on the precursor(s) used and/or the process temperature during the epitaxial process. Suitable carrier gases can be or include nitrogen, argon, helium, or other gases which are inert with respect to the epitaxial process. The carrier gas may have a flow rate from about 0.1 slm to about 20 slm, such as from about 0.5 slm to about 6 slm.

In other embodiments, the nitride capping layer 250 can be formed by nitridation of surfaces (e.g., outer surfaces or upper surfaces) of the metal silicide nitride layer 230. As such, the nitride capping layer 250 contains or includes a metal silicide nitride. The nitridation process can be a thermal nitridation process and/or a plasma nitridation process. For example, the nitridation process can be any of the nitridation processes described or discussed herein.

Figure 3:
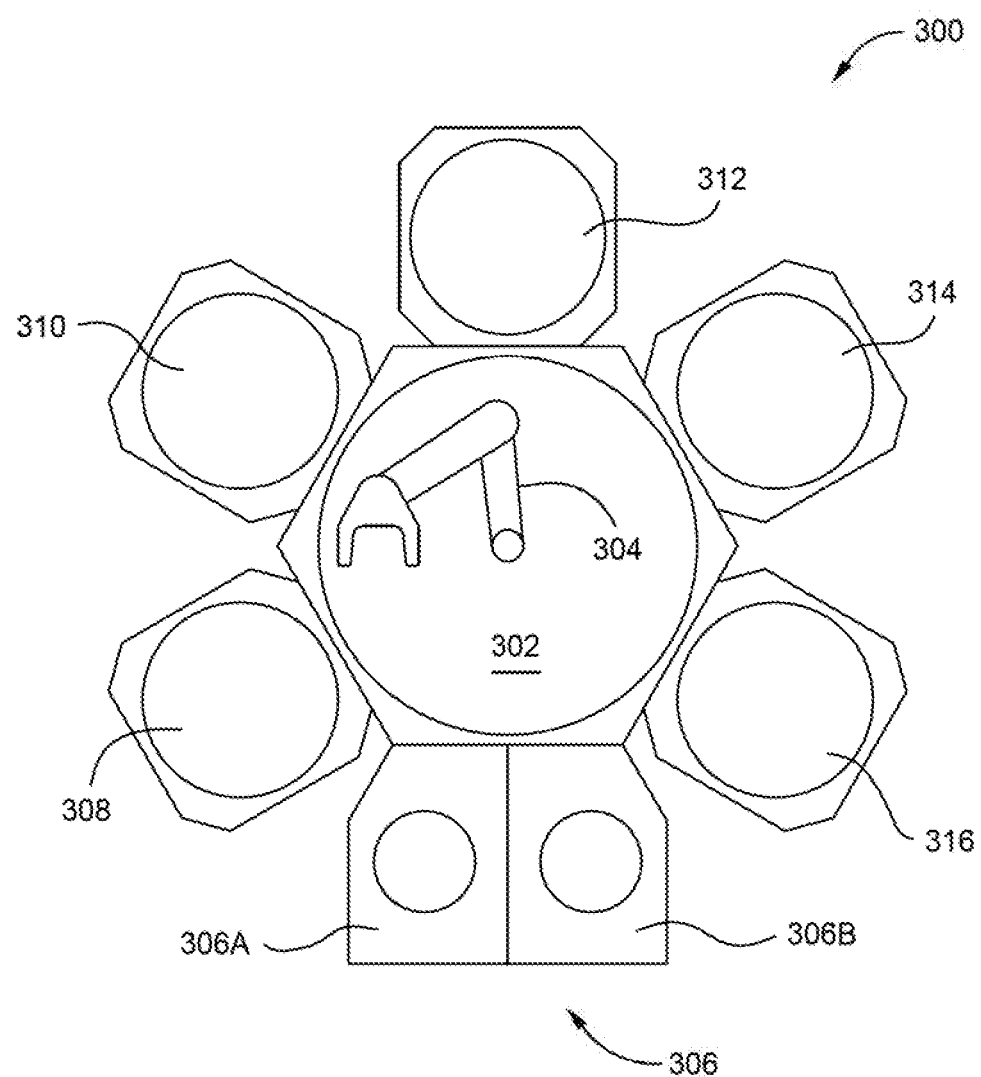
FIG. 3 depicts a schematic top view of a processing system that can be used to perform the method illustrated by the flow chart of FIG. 1, as discussed and described in one or more embodiments herein.

FIG. 3 is a schematic top view of a processing system 300 that can be used to perform or conduct the process 100 illustrated by the flow chart of FIG. 1 according to embodiments described herein. In some examples, the processing system 300 can be or include a cluster tool. One example of the processing system 300 is the CENTURA® system, commercially available from Applied Materials, Inc. of Santa Clara, Calif. A transfer robot 304 of any convenient type is disposed in a transfer chamber 302 of the processing system 300. A load-lock 306, with two load-lock chambers 306A, 306B is coupled to the transfer chamber 302. A plurality of processing chambers 308, 310, 312, 314, and 316 are also coupled to the transfer chamber 302. The plurality of processing chamber 308, 310, 312, 314, and 316 may include one or more of the chambers, such as a cleaning chamber, an epitaxial chamber, a silicide chamber, a nitridation chamber, an oxidation chamber, an etching chamber, or any combination thereof.

The processing chamber 308 may be a cleaning chamber configured to clean a substrate prior to the deposition of epitaxial and/or silicide materials. For example, the processing chamber 308 may be a pre-clean chamber using remote plasma source. In one embodiment, the processing chamber 308 is an AKTIV Pre-Clean™ chamber available from Applied Materials, Inc. of Santa Clara, Calif. The processing chamber 308 uses electrically neutral radicals (e.g., hydrogen radicals) to react with and clean oxides and/or contaminants on a substrate as discussed above in blocks 104 and/or 108.

The processing chamber 310 may be a thermal processing chamber configured to deposit material on a substrate. For example, the processing chamber 310 may be a material deposition chamber such as an epitaxy chamber. In one embodiment, the processing chamber 310 is a Centura® RP EPI chamber, commercially available from Applied Materials, Inc. of Santa Clara, Calif. The processing chamber 314 may be used to perform an epitaxial growth process as discussed above in block 106.

The processing chamber 312 may be a cleaning chamber configured to clean a substrate prior to deposition. For example, the processing chamber 312 may be a capacitively coupled processing chamber. In one embodiment, the processing chamber 312 is a SICONI® Preclean chamber, commercially available from Applied Materials, Inc. of Santa Clara, Calif. In other embodiments, the processing chamber 312 may be an etching chamber configured to etch material from a substrate. For example, the processing chamber 312 may be a plasma chamber such as an ICP plasma chamber. In one embodiment, the processing chamber 312 is a Centura® Advantedge™ Mesa™ Etch chamber available from Applied Materials, Inc. of Santa Clara, Calif. The processing chamber 312 may be used to perform the cleaning process as discussed above in blocks 104 and/or 108.

The processing chamber 314 may be a thermal processing chamber configured to deposit material on a substrate. For example, the processing chamber 314 may be a silicide chamber or other deposition chamber such as an epitaxy chamber. In one embodiment, the processing chamber 314 is a Centura® RP EPI chamber, commercially available from Applied Materials, Inc. of Santa Clara, Calif. The processing chamber 314 may be used to perform a silicide deposition, a metal silicide deposition, a nitride deposition, and/or an epitaxial growth process as discussed above in blocks 110.

The processing chamber 316 may be a nitridation or thermal processing chamber configured to provide a controlled nitridation and/or thermal cycle that heats a substrate. In one or more examples, the processing chamber 316 is a nitridation processing chamber. The processing chamber 316 can have an RPS or in situ plasma system for generating a nitrogen plasma, as discussed above in block 112. In other examples, the processing chamber 316 is a thermal processing chamber. In one embodiment, the processing chamber 316 is a VANTAGE® RADOX™ RTP chamber available from Applied Materials, Inc. of Santa Clara, Calif. The processing chamber 310 may be used to perform downstream processing after deposition, such as thermal or plasma annealing, thermal or plasma cleaning, thermal or plasma chemical vapor deposition, thermal or plasma nitridation, or thermal or plasma oxidation.

In one or more embodiments, the processing chamber 316 may be another chamber such as any one of the processing chambers 308, 310, 312, or 314. For example, the processing chamber 316 may be a cleaning chamber configured to clean a substrate (e.g., after deposition), a plasma chamber, a thermal processing chamber configured to provide a controlled thermal cycle that heats a substrate, a deposition chamber configured to deposit another material, or another type of processing chamber. In some embodiments, the processing chamber 316 may be absent or simply not used during an operation.

During processing, a substrate that is to be processed may arrive to the processing system 300 in a pod (not shown). The substrate is introduced into the processing system 300 at block 102 of process 100. The substrate is transferred from the pod to the vacuum compatible load-lock 306A, 306B by the factory interface robot (not shown). The substrate is then handled by the transfer robot 304 in the transfer chamber 302, which is generally kept in a vacuum state. The transfer robot 304 then loads the substrate into either the processing chamber 308 or the processing chamber 312 for cleaning of the substrate, as described in block 104. Upon completion of the cleaning, the transfer robot 304 then picks up the substrate from the processing chamber 308 or 312 and loads the substrate into the processing chamber 310 for an epitaxial deposition process, such as epitaxial growth of material (e.g., Si-epi), as described in block 106. The transfer robot 304 then picks up the substrate from the processing chamber 310 and may load the substrate into the processing chamber 312 for cleaning materials from the epitaxial layer, as described in block 108. The transfer robot 304 then picks up the substrate from the processing chamber 312 and loads the substrate into the processing chamber 314 for depositing a metal silicide seed layer on the epitaxial layer, as described in block 110.

Thereafter, the transfer robot 304 then picks up the substrate from the processing chamber 314 and loads the substrate into the processing chamber 316 for exposing the metal silicide seed layer to a nitridation process to produce a metal silicide nitride layer from at least a portion of the metal silicide seed layer, as described in block 112. The transfer robot 304 then picks up the substrate from the processing chamber 316 and loads the substrate into the processing chamber 314 for depositing a metal silicide bulk layer on the metal silicide nitride layer, as described in block 114. The transfer robot 304 then picks up the substrate from the processing chamber 314 and loads the substrate into the processing chamber 316 for depositing a nitride capping layer (e.g., metal nitride and/or silicon nitride) on the metal silicide bulk layer.

Subsequently, the transfer robot 304 picks up the substrate from the processing chamber 316 and optional loads the substrate into any one or more of the processing chambers 308, 310, 312, and/or 314 for any downstream processing, such as thermal or plasma annealing, thermal or plasma cleaning, thermal or plasma chemical vapor deposition, as discussed above. Alternatively, the transfer robot 304 move the substrate from the processing chamber 316 and loads the substrate into the load-lock 306B for removal from the processing system 300. During the process 100, all operations (blocks 104, 106, 108, 110, 112, 114, and 116) are performed within the same processing system, therefore the substrate is not exposed to atmosphere (e.g., vacuum is not broken) as the substrate is transferred to various processing chambers, which decreases the chance of contamination and improves the quality of the deposited epitaxial film and the silicide layers and materials.

The transfer chamber 302 may remain under vacuum and/or at a pressure below atmosphere during the process. The vacuum level of the transfer chamber 302 may be adjusted to match the vacuum level of corresponding processing chambers. For example, when transferring a substrate from a transfer chamber 302 into a processing chamber (or vice versa), the transfer chamber 302 and the processing chamber may be maintained at the same vacuum level. Then, when transferring a substrate from the transfer chamber to the load lock chamber or batch load lock chamber (or vice versa), the transfer chamber vacuum level may match the vacuum level of the load-lock chamber 306A, 306B even through the vacuum level of the load-lock chamber and the processing chamber may be different.

In one or more embodiments, the processing system 300 (e.g., cluster tool) includes a transfer chamber 302 coupled to one or more load-lock chambers 306A, 306B and a first cleaning chamber 308 coupled to the transfer chamber 302. The first cleaning chamber 308 contains an inductively coupled plasma source and the first cleaning chamber 308 is in fluid communication with a source of hydrogen ($H_2$). The processing system 300 includes an epitaxy chamber 310 is coupled to the transfer chamber 302. The epitaxy chamber 310 contains a liquid precursor vaporizer and is in fluid communication with a first source of silicon (not shown). The processing system 300 also includes a second cleaning chamber 312 coupled to the transfer chamber 302. The second cleaning chamber 312 contains a capacitively coupled plasma source and a substrate support coupling to a bias RF power supply and/or contains or is in fluid communication with a remote plasma system. The second cleaning chamber 312 can be in fluid communication with a source of a fluorine-containing compound (e.g., $NF_3$), ammonia, hydrogen ($H_2$), or any combination thereof. The processing system 300 also includes a silicide chamber 314 coupled to the transfer chamber 302. The silicide chamber 314 contains or is in fluid communication with a remote plasma system and a second source of silicon and a source of a metal-containing compound. The processing system 300 further includes a nitridation chamber 316 coupled to the transfer chamber 302. The nitridation chamber 316 contains or is in fluid communication with a plasma source and is in fluid communication with a source of nitrogen (not shown). In some embodiment, the nitridation chamber 316 can also be used to form or otherwise deposit one or more nitride capping layers on the metal silicide bulk layer. The nitride capping layer contains a metal nitride, a silicon nitride, or a combination thereof and can be produced by the nitridation chamber 316.

Methods described and discussed herein provide many advantages over previous silicide process techniques. The metal silicide nitride layer at the interface between the epitaxial layer and the metal silicide bulk layer provides thermal stability to the metal silicide bulk layer in later thermal processes (e.g., high-K spike anneal process at about 700° C. to about 1,100° C. or about 850° C. to about 950° C. and/or silicide spike anneal process at about 400° C. to about 800° C. or about 550° C. to about 650° C.). This thermal stability reduces or eliminates agglomeration to the metal silicide bulk layer which otherwise would cause film discontinuity and greater resistivity (Rc). The nitride capping layer disposed on the epitaxial layer reduces or prevents oxidation to the epitaxial layer.

Embodiments of the present disclosure further relate to any one or more of the following paragraphs 1-22:

1. A method of processing a substrate, comprising: depositing an epitaxial layer on the substrate; depositing a metal silicide seed layer on the epitaxial layer; exposing the metal silicide seed layer to a nitridation process to produce a metal silicide nitride layer from at least a portion of the metal silicide seed layer; depositing a metal silicide bulk layer on the metal silicide nitride layer; and forming or depositing a nitride capping layer on the metal silicide bulk layer, wherein the nitride capping layer comprises a metal nitride, a silicon nitride, a metal silicide nitride, or a combination thereof.

2. A method of processing a substrate, comprising: depositing an epitaxial layer on the substrate; exposing the epitaxial layer to a clean process; then depositing a metal silicide seed layer on the epitaxial layer, wherein the metal silicide seed layer comprises titanium silicide or nickel silicide, and wherein the metal silicide seed layer has a thickness of about 0.2 nm to about 2.5 nm; exposing the metal silicide seed layer to a nitridation process to produce a metal silicide nitride layer from at least a portion of the metal silicide seed layer; depositing a metal silicide bulk layer on the metal silicide nitride layer, wherein the metal silicide bulk layer comprises titanium silicide or nickel silicide, and wherein the metal silicide bulk layer has a thickness of about 4 nm to about 20 nm; and forming or depositing a nitride capping layer on the metal silicide bulk layer, wherein the nitride capping layer comprises a metal nitride, a silicon nitride, a metal silicide nitride, or a combination thereof.

3. A cluster tool for processing a substrate, comprising: a transfer chamber coupled to a load-lock chamber; a cleaning chamber coupled to the transfer chamber, wherein the cleaning chamber comprises an inductively coupled plasma source and is in fluid communication with a source of hydrogen; an epitaxy chamber coupled to the transfer chamber, wherein the epitaxy chamber comprises a liquid precursor vaporizer and is in fluid communication with a first source of silicon; a silicide chamber coupled to the transfer chamber, wherein the silicide chamber comprises a remote plasma system and is in fluid communication with a second source of silicon and a source of a metal-containing compound; and a nitridation chamber coupled to the transfer chamber, wherein the nitridation chamber comprises a plasma source and is in fluid communication with a source of nitrogen.

4. The method and/or the cluster tool according to any one of paragraphs 1-3, wherein the metal silicide seed layer comprises titanium silicide or nickel silicide.

5. The method and/or the cluster tool according to any one of paragraphs 1-4, wherein the metal silicide seed layer has a thickness of about 0.2 nm to about 2.5 nm.

6. The method and/or the cluster tool according to any one of paragraphs 1-5, wherein the nitridation process comprises: heating the substrate to a temperature of about 300° C. to about 600° C.; generating a plasma from a reagent gas comprising ammonia; and exposing the metal silicide seed layer to the plasma.

7. The method and/or the cluster tool according to any one of paragraphs 1-6, wherein the substrate is heated to a temperature of about 400° C. to about 500° C., and the nitridation process lasts for about 0.5 seconds to about 5 minutes.

8. The method and/or the cluster tool according to any one of paragraphs 1-7, wherein the metal silicide bulk layer comprises titanium silicide or nickel silicide.

9. The method and/or the cluster tool according to any one of paragraphs 1-8, wherein the metal silicide bulk layer has a thickness of about 4 nm to about 20 nm.

10. The method and/or the cluster tool according to any one of paragraphs 1-9, further comprising exposing the substrate to a clean process prior to depositing the epitaxial layer.

11. The method and/or the cluster tool according to paragraph 10, wherein the clean process comprises: generating a plasma from a reagent gas comprising hydrogen ($H_2$); and exposing the substrate to the plasma.

12. The method and/or the cluster tool according to paragraph 10, wherein the clean process comprises: generating a plasma from a reagent gas comprising ammonia and nitrogen trifluoride; and exposing the substrate to the plasma.

13. The method and/or the cluster tool according to paragraph 12, wherein the substrate is exposed to the plasma for a period of about 0.1 seconds to about 10 minutes.

14. The method and/or the cluster tool according to any one of paragraphs 1-13, further comprising exposing the epitaxial layer to a clean process prior to depositing the metal silicide seed layer.

15. The method and/or the cluster tool according to paragraph 14, wherein the clean process comprises: generating a plasma from a reagent gas comprising hydrogen ($H_2$); and exposing the epitaxial layer to the plasma.

16. The method and/or the cluster tool according to paragraph 14, wherein the clean process comprises: generating a plasma from a reagent gas comprising ammonia and nitrogen trifluoride; and exposing the epitaxial layer to the plasma.

17. The method and/or the cluster tool according to any one of paragraphs 1-16, wherein the metal nitride in the nitride capping layer comprises titanium nitride or nickel nitride.

18. The method and/or the cluster tool according to any one of paragraphs 1-17, wherein forming or depositing the nitride capping layer on the metal silicide bulk layer further comprises exposing the metal silicide bulk layer to a nitridation process to convert at least a portion of the metal silicide bulk layer to the metal silicide nitride while producing the nitride capping layer comprising the metal silicide nitride.

19. The method and/or the cluster tool according to any one of paragraphs 1-18, wherein forming or depositing the nitride capping layer on the metal silicide bulk layer further comprises depositing a metal nitride layer by a vapor deposition process while producing the nitride capping layer comprising the metal nitride.

20. The method and/or the cluster tool according to any one of paragraphs 1-19, wherein forming or depositing the nitride capping layer on the metal silicide bulk layer further comprises depositing a metal layer by a vapor deposition process and exposing the metal layer to a nitridation process to convert the metal layer to the metal nitride while producing the nitride capping layer comprising the metal nitride.

21. The method and/or the cluster tool according to any one of paragraphs 1-20, wherein forming or depositing the nitride capping layer on the metal silicide bulk layer further comprises depositing a silicon nitride layer by a vapor deposition process while producing the nitride capping layer comprising the silicon nitride.

22. The method and/or the cluster tool according to any one of paragraphs 1-21, wherein the epitaxial layer is a source/drain film in an nMOS or pMOS device.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method of processing a substrate, comprising:
depositing an epitaxial layer on the substrate;
depositing a metal silicide seed layer on the epitaxial layer;
exposing the metal silicide seed layer to a nitridation process to produce a metal silicide nitride layer from at least a portion of the metal silicide seed layer;
depositing a metal silicide bulk layer on the metal silicide nitride layer; and
forming or depositing a nitride capping layer on the metal silicide bulk layer, wherein the nitride capping layer comprises a metal nitride, a silicon nitride, a metal silicide nitride, or a combination thereof.

2. The method of claim 1, wherein the metal silicide seed layer comprises titanium silicide or nickel silicide.

3. The method of claim 1, wherein the metal silicide seed layer has a thickness of about 0.2 nm to about 2.5 nm.

4. The method of claim 1, wherein the nitridation process comprises:
heating the substrate to a temperature of about 300° C. to about 600° C.;
generating a plasma from a reagent gas comprising ammonia; and
exposing the metal silicide seed layer to the plasma.

5. The method of claim 4, wherein the substrate is heated to a temperature of about 400° C. to about 500° C., and the nitridation process lasts for about 0.5 seconds to about 5 minutes.

6. The method of claim 1, wherein the metal silicide bulk layer comprises titanium silicide or nickel silicide.

7. The method of claim 1, wherein the metal silicide bulk layer has a thickness of about 4 nm to about 20 nm.

8. The method of claim 1, further comprising exposing the substrate to a clean process prior to depositing the epitaxial layer.

9. The method of claim 8, wherein the clean process comprises:
generating a plasma from a reagent gas comprising hydrogen ($H_2$); and
exposing the substrate to the plasma.

10. The method of claim 8, wherein the clean process comprises:
generating a plasma from a reagent gas comprising ammonia and nitrogen trifluoride; and
exposing the substrate to the plasma.

11. The method of claim 10, wherein the substrate is exposed to the plasma for a period of about 0.1 seconds to about 10 minutes.

12. The method of claim 1, further comprising exposing the epitaxial layer to a clean process prior to depositing the metal silicide seed layer.

13. The method of claim 12, wherein the clean process comprises:
  generating a plasma from a reagent gas comprising hydrogen ($H_2$); and
  exposing the epitaxial layer to the plasma.

14. The method of claim 12, wherein the clean process comprises:
  generating a plasma from a reagent gas comprising ammonia and nitrogen trifluoride; and
  exposing the epitaxial layer to the plasma.

15. The method of claim 1, wherein the metal nitride in the nitride capping layer comprises titanium nitride or nickel nitride.

16. The method of claim 1, wherein forming or depositing the nitride capping layer on the metal silicide bulk layer further comprises:
  exposing the metal silicide bulk layer to a nitridation process to convert at least a portion of the metal silicide bulk layer to the metal silicide nitride while producing the nitride capping layer comprising the metal silicide nitride; or
  depositing a metal nitride layer by a vapor deposition process while producing the nitride capping layer comprising the metal nitride; or
  depositing a metal layer by a vapor deposition process and exposing the metal layer to a nitridation process to convert the metal layer to the metal nitride while producing the nitride capping layer comprising the metal nitride; or
  depositing a silicon nitride layer by a vapor deposition process while producing the nitride capping layer comprising the silicon nitride.

17. The method of claim 1, wherein the epitaxial layer is a source/drain film in an nMOS or pMOS device.

18. A method of processing a substrate, comprising:
  depositing an epitaxial layer on the substrate;
  exposing the epitaxial layer to a clean process; then
  depositing a metal silicide seed layer on the epitaxial layer, wherein the metal silicide seed layer comprises titanium silicide or nickel silicide, and wherein the metal silicide seed layer has a thickness of about 0.2 nm to about 2.5 nm;
  exposing the metal silicide seed layer to a nitridation process to produce a metal silicide nitride layer from at least a portion of the metal silicide seed layer;
  depositing a metal silicide bulk layer on the metal silicide nitride layer, wherein the metal silicide bulk layer comprises titanium silicide or nickel silicide, and wherein the metal silicide bulk layer has a thickness of about 4 nm to about 20 nm; and
  forming or depositing a nitride capping layer on the metal silicide bulk layer, wherein the nitride capping layer comprises a metal nitride, a silicon nitride, a metal silicide nitride, or a combination thereof.

19. The method of claim 18, wherein the nitridation process comprises:
  heating the substrate to a temperature of about 300° C. to about 600° C.;
  generating a plasma from a reagent gas comprising ammonia; and
  exposing the metal silicide seed layer to the plasma.

* * * * *